United States Patent
Shoji et al.

(10) Patent No.: US 10,319,807 B2
(45) Date of Patent: Jun. 11, 2019

(54) WAFER GROUP, WAFER MANUFACTURING DEVICE, AND WAFER MANUFACTURING METHOD

(71) Applicant: DOWA ELECTRONICS MATERIALS CO., LTD., Tokyo (JP)

(72) Inventors: Shinya Shoji, Akita (JP); Makoto Ishii, Akita (JP); Kazuyuki Umetsu, Akita (JP); Junji Sugiura, Akita (JP)

(73) Assignee: DOWA ELECTRONICS MATERIALS CO., LTD., Tokyo (JP)

(*) Notice: Subject to any disclaimer, the term of this patent is extended or adjusted under 35 U.S.C. 154(b) by 0 days.

(21) Appl. No.: 15/533,312

(22) PCT Filed: Dec. 9, 2015

(86) PCT No.: PCT/JP2015/084529
§ 371 (c)(1),
(2) Date: Jun. 5, 2017

(87) PCT Pub. No.: WO2016/098662
PCT Pub. Date: Jun. 23, 2016

(65) Prior Publication Data
US 2018/0026092 A1    Jan. 25, 2018

(30) Foreign Application Priority Data
Dec. 18, 2014  (JP) ................... 2014-256502

(51) Int. Cl.
*H01L 21/02*  (2006.01)
*H01L 21/304*  (2006.01)
(Continued)

(52) U.S. Cl.
CPC ............ *H01L 29/06* (2013.01); *B28D 5/00* (2013.01); *B28D 5/0011* (2013.01);
(Continued)

(58) Field of Classification Search
CPC ............. H01L 29/06; H01L 21/02013; H01L 21/02021; H01L 21/304;
(Continued)

(56) References Cited

U.S. PATENT DOCUMENTS 4,864,779 A  *  9/1989  Ozaki .................... B24B 9/065
                                          451/5
5,087,307 A  *  2/1992  Nomura ................ B24B 9/065
                                          156/153
(Continued)

FOREIGN PATENT DOCUMENTS

JP        63228721 A  *  9/1988
JP        63228721 A  *  9/1988
(Continued)

OTHER PUBLICATIONS

Mar. 1, 2016 International Search Report issued in Patent Application No. PCT/JP2015/084529.

Primary Examiner — Marvin Payen
Assistant Examiner — Jeremy J Joy
(74) Attorney, Agent, or Firm — Oliff PLC

(57) ABSTRACT

A wafer group facilitates securing uniformity of products manufactured from the wafer group whose composition varies among wafers. A technique excludes uncertain factors in forming OF, forming OF with extremely high probability and extremely high accuracy, the wafer group being constituted by a plurality of wafers obtained from the same ingot, with all wafers having an orientation flat (OF), wherein the wafer group is constituted by 70 or more wafers, and in the OF orientation accuracy of the wafer group represented by an angle, the OF orientation accuracy in each wafer is within ±0.010°.

16 Claims, 7 Drawing Sheets

(51) Int. Cl.
*H01L 29/06* (2006.01)
*B28D 5/00* (2006.01)
*H01L 21/66* (2006.01)

(52) U.S. Cl.
CPC ...... *B28D 5/0023* (2013.01); *H01L 21/02005* (2013.01); *H01L 21/02013* (2013.01); *H01L 21/02021* (2013.01); *H01L 21/02035* (2013.01); *H01L 21/304* (2013.01); *H01L 22/12* (2013.01)

(58) Field of Classification Search
CPC ...... H01L 21/02005–21/02035; B28D 5/0011; B28D 5/0005–5/0052; B28D 5/0023; B28D 5/0082
See application file for complete search history.

(56) References Cited

U.S. PATENT DOCUMENTS

| | | | | |
|---|---|---|---|---|
| 5,279,077 A | * | 1/1994 | Miyashita | B28D 5/0005 451/44 |
| 5,557,214 A | * | 9/1996 | Barnett | G01R 1/073 29/884 |
| 5,763,290 A | * | 6/1998 | Nakajima | H01S 5/0201 438/33 |
| 7,351,282 B2 | * | 4/2008 | Yamaguchi | B28D 5/00 117/13 |
| 2006/0014383 A1 | * | 1/2006 | Otsuki | B28D 1/221 438/680 |
| 2006/0169988 A1 | * | 8/2006 | Itani | C30B 33/00 257/79 |
| 2006/0249135 A1 | * | 11/2006 | Matsumoto | B28D 5/045 125/21 |
| 2008/0014756 A1 | * | 1/2008 | Ishibashi | B24B 37/042 438/759 |
| 2009/0057847 A1 | * | 3/2009 | Nakayama | C30B 29/406 257/627 |
| 2013/0134434 A1 | * | 5/2013 | Mikami | B82Y 20/00 257/76 |
| 2016/0211218 A1 | * | 7/2016 | Hara | H01L 23/544 |

FOREIGN PATENT DOCUMENTS

| | | | |
|---|---|---|---|
| JP | S63-228721 A | | 9/1988 |
| JP | 2000-124159 A | | 4/2000 |
| JP | 2001-300869 A | | 10/2001 |
| JP | 2005-243976 A | | 9/2005 |
| JP | 2006-066643 A | | 3/2006 |
| JP | 2006066643 A | * | 3/2006 |
| JP | 2006066643 A | * | 3/2006 |
| JP | 2011-060985 A | | 3/2011 |
| JP | 2012-126143 A | | 7/2012 |

* cited by examiner (a)

(b)

WAFER GROUP, WAFER MANUFACTURING DEVICE, AND WAFER MANUFACTURING METHOD

TECHNICAL FIELD

The present invention relates to a wafer group, a wafer manufacturing device, and a wafer manufacturing method, and particularly to a wafer group having two opposed main surfaces and an orientation flat (OF) formed by cleavage, and the wafer manufacturing device, and the wafer manufacturing method.

DESCRIPTION OF RELATED ART

A Wafer (for example, a silicon wafer or GaAs wafer) is mainly used for a semiconductor device. Such a wafer is produced by slicing an ingot as shown in Patent Document 1.

PRIOR ART DOCUMENT

Patent Document

Patent Document 1: Japanese Patent Laid Open Publication No. 2005-243976

SUMMARY OF THE INVENTION

Problem to be Solved by the Invention

In the wafer, in order to control electrical characteristics of a crystal, a predetermined element (hereinafter referred to as A "carrier") is added as an impurity. Of course, this also applies to an ingot as a basis of the wafer. The carrier tends to segregate in a crystal melt. Therefore, a carrier concentration is varied (for example, increases) from one end of the ingot produced by crystal growth to another one end thereof.

Then, in the wafer obtained from the same ingot, naturally, the carrier concentration is not constant among wafers. Specifically, in a plurality of wafers cut out from the same ingot, the carrier concentration of a wafer A2 adjacent to the other end side increases as viewed from the wafer A1 cut from the vicinity of one end of the ingot. This is also applied to the carrier concentration of the wafer A3 adjacent to the other end side as viewed from the wafer A2, when such a case is taken into consideration.

Suppose that 100 wafers are cut out from the same ingot. For the wafer A100 cut out from the vicinity of the other end from the wafer A1 cut out from the vicinity of one end of the ingot, a plot is formed in which each wafer number (A "1", A "2", ... A "99", A "100") is taken as the X axis and the carrier concentration in each wafer is taken as the Y axis, in an appearance of a straight line or a curve having continuity. This is because each wafer is made from the same ingot.

This also applies to defects occurring in the ingot. In other words, when observing each wafer in the abovementioned numerical order, a position and a size of the defect in each wafer are gradually varied.

FIG. 1 is a graph when the plot is a straight line. For the convenience of explanation, the Y axis is calculated assuming that a variation amount (here, an increase amount) of the carrier concentration is taken as one unit when each wafer number increases. For the sake of describing this embodiment in an easy-to-understand manner, explanation will be given hereafter, with reference to FIG. 1 or a modified version thereof (FIG. 2).

Originally it is preferable that the wafers are perfectly identical in terms of a composition or a position and a size of the defect. This is because if they are completely identical, even when a semiconductor device or the like is manufactured using a wafer, manufacturing steps can be performed under the same condition, with no need for varying conditions for each wafer, when a different substance is provided on the wafer.

However, as each wafer is manufactured from the ingot, variation in carrier concentration is inevitable. Then, in a case of manufacturing a semiconductor device or the like using the wafer, conditions are varied for providing a different substance on the wafer. On the other hand, however, in each wafer made from the same ingot, when how the carrier concentration is varied is known in advance, or in other words, when the continuity of the carrier concentration is known in advance, it is also possible to continuously vary the conditions for providing a different substance on the wafer, depending on the continuity of the carrier concentration. As a result, it is possible to uniformize various characteristics of the finally manufactured semiconductor device or the like, in each semiconductor device or the like.

However, here, a major problem arises concerning an orientation flat on the wafer (hereinafter simply referred to as "OF").

OF is a flat plane formed on a periphery of the wafer and is a large criterion indicating a direction (for example, refer to [0002] of Patent Document 1) when manufacturing a semiconductor device for example. On the other hand, the wafer is often very brittle in most cases. Therefore, when OF is formed, the wafer does not cleave as planned, and there remains a step in OF, that is, the cleavage plane. As a result, deviation occurs in linearity of OF in plan view with respect to a crystal plane of the wafer. The degree of such deviation is referred to as "OF orientation accuracy", and OF orientation accuracy in this specification is represented by an angle (°) after investigating the deviation from the crystal plane where OF is supposed to be formed, by an X-ray diffraction technique, and the deviation in a predetermined direction is denoted by +, and the deviation in an opposite direction to the above direction is denoted by −.

When the OF orientation accuracy is not satisfactory in a certain wafer, processing applied to the wafer for manufacturing a semiconductor device, is also affected by the OF orientation accuracy, resulting in great reduction in accuracy of an arrangement relation of each constituent element of the semiconductor device during manufacture.

Therefore, when a wafer group obtained from the same ingot is provided to an orderer, wafers that could not successfully form OF, that is, wafers with poor OF orientation accuracy are excluded before being provided to the orderer. Otherwise, information on OF orientation accuracy is presented to the orderer in advance, and the wafer is selected on the side of the orderer.

In any case, conventionally, when the wafer group is obtained from the same ingot, not a small number of wafers with poor OF orientation accuracy are produced as a result.

When 100 wafers are assumed to be cut out from the same ingot, the above result means that 100 wafers with satisfactory OF orientation accuracy cannot necessarily be obtained. In other words, the above result means that in a wafer group consisting of 100 wafers, so-called "one wafer is in a state of missing teeth" is frequently generated.

Then, despite obtaining the wafer group from the same ingot, continuity of the composition and the defect among wafers is lost. FIG. 2 shows this state. The broken line in FIG. 2 is a variation in the carrier concentration which is ideal when the wafer number advances as shown in FIG. 1. However, if the wafer in a state of missing teeth is generated in the wafer group, the carrier concentration shows a behavior as indicated by the solid line in FIG. 2, as the wafer number advances. That is, the continuity of the composition assumed in the wafer group and the continuity of an actual composition are largely deviated from each other.

If such a situation occurs, when the semiconductor device or the like is manufactured from the wafer, even if a variation is made in conditions for providing a different substance on the wafer, a large discrepancy arises between such conditions and the continuity of the composition and the defect among wafers. As a result, there is a possibility that large variations occur in product performance of the semiconductor device or the like.

Patent Document 1 mentioned above is known as a method for manufacturing a wafer with satisfactory OF orientation accuracy. In Patent Document 1, OF is formed by stress and scribing (see [0024] of Patent Document 1). Further, as described in [0036] of Japanese Patent Application Laid-Open No. 2005-243976 and [0024] of Japanese Patent Application Laid-Open No. 2001-300869, most of the examples are cases where an operator forms the OF by hand.

As will be described in the items of the embodiments hereafter, the present inventors carried out an operation of actually forming OF for more than 13,000 wafers including the examples of the present invention and comparative examples.

As a result, the present inventors obtain a knowledge such that in a conventional technique, even if a satisfactory OF can be formed for a single wafer, it is extremely difficult to continuously form satisfactory OF with high probability. That is, it is found that there are uncertain factors in the conventional method, such that whether or not a satisfactory OF can be formed depends on luck to some extent.

In addition, to make matters worse, with a miniaturization of elements in semiconductor devices, desired OF orientation accuracy is getting stricter year by year. More specifically, OF orientation accuracy required by SEMI standard which is one of the standards related to semiconductor devices is ±0.5°. However, a more strict reference value is required when OF is formed by cleavage. As a knowledge of the present inventor, a strict reference value of within ±0.02° is required. Needless to say, if the desired OF orientation accuracy is getting stricter, an amount of the wafer in a state of missing teeth is increased in the wafer group. This is because wafers which are regarded as acceptable conventionally and which constitute the wafer group, were rejected due to strict reference values, and the wafers regarded as rejected become newly wafers in a state of missing teeth. As a result, continuity is further lost in the wafer group obtained from the same ingot, and consequently, a large discrepancy arises between the conditions for providing a different substance on the wafer and the continuity of the composition and the defect among wafers. In such a case, large variations occur in a product performance of the semiconductor device or the like, and there is a higher possibility that the uniformity of the product cannot be secured.

It is conceivable that a manufacturer selects and collects wafers with satisfactory OF orientation accuracy. However, in such a case, yield of wafers that can be recovered from the same ingot becomes poor remarkably, and the abovementioned continuity naturally drops considerably.

Further, when information is attached on the OF orientation accuracy and the wafer group obtained from the same ingot is provided to an orderer without wafers like missing teeth, the continuity of the composition and the defect of the wafer are surely secured at this time point. However, when the orderer ultimately seeks satisfactory OF orientation accuracy, the orderer is required to remove unqualified wafers from the wafer group, resulting in generating wafer in a state of missing teeth, and in addition imposing a heavy burden on the orderer.

As one of the problems to be solved by the present invention, an object of the present invention is to provide a wafer group that facilitates securing uniformity of products manufactured from the wafer group whose composition varies among wafers.

Another object of the present invention is to provide a technique of excluding uncertain factors in forming OF, and forming OF with extremely high probability and extremely high accuracy.

Means for Solving the Problem

The present invention is provided based on a knowledge obtained as a result of performing a work of actually forming OF for more than 13,000 wafers, including examples of the present invention and comparative examples, and aspects of the present invention are as follows.

According to a first aspect of the present invention, there is provided a wafer group constituted by a plurality of wafers obtained from the same ingot, with all wafers having an orientation flat (OF), wherein the wafer group is constituted by 70 or more wafers, and in the OF orientation accuracy of the wafer group represented by an angle, the OF orientation accuracy in each wafer is within ±0.010°.

According to a second aspect of the present invention, there is provided the wafer group of the first aspect, wherein at least one of the following conditions are satisfied, (Condition 1) A value obtained by subtracting a minimum value from a maximum value of the OF orientation accuracy in each wafer, is 0.010° or less.

(Condition 2) A value obtained by subtracting an average value of the OF orientation accuracy of the wafer group from the maximum value of the OF orientation accuracy in each wafer, is 0.006° or less.

(Condition 3) A value obtained by subtracting the minimum value of the OF orientation accuracy in each wafer from the average value of the OF orientation accuracy of the wafer group, is 0.006° or less.

(Condition 4) A standard deviation of the OF orientation accuracy of the wafer group, is 0.0015 or less.

According to a third aspect of the present invention, there is provided the wafer group of the first or second aspect, wherein for each wafer constituting the wafer group, a plot is formed in which the number of each wafer sequentially given from the side close to one end of the ingot is taken as X axis, and a concentration of a predetermined element in each wafer is taken as Y axis, and in this plot, the number of portions where continuity of the plot is lost, is a number equal to or less than 10% of a value obtained by adding the number of this portions to a total number of the wafers in the wafer group, and an increase/decrease value of the concentration of the predetermined element in a wafer of the next number is three times or less than the increase/decrease value assumed from the continuity of the plot, as compared with the wafer of an arbitrary number.

According to a fourth aspect of the present invention, there is provided the wafer group of any one of the first to third aspects, wherein the wafer is a semiconductor wafer having a cleavage property.

According to a fifth aspect of the present invention, there is provided the wafer group of any one of the first to fourth aspects, wherein a plane constituting OF is any one of (011), (0-1-1), (0-11) and (01-1).

According to a sixth aspect of the present invention, there is provided a wafer manufacturing device, with a wafer having two opposed lower and upper surfaces and an orientation flat (OF) formed by cleavage, including:

a stage which can be freely switched between fixing of the wafer and a release of a fixture from the lower surface, and which can be freely double-opened;

a scriber which puts scribe on the lower surface for cleaving the wafer, and which is disposed in a belt-like gap at a joint of the double-open stage, and movable along the gap;

a pressing part disposed above the stage and movable in a vertical direction; and a door opening mechanism for double-opening the stage downward in conjunction with a downward movement of the pressing part, wherein the pressing part includes an indenter which has a long portion for pressing the upper surface of the wafer, and which is disposed above the gap and along the gap of the stage so as to be is freely swingable along the gap in a pendulum manner.

According to a seventh aspect of the present invention, there is provided the wafer manufacturing device of the sixth aspect, wherein the pressing part further includes the door opening mechanism, and the door opening mechanism is a protruding part protruding downward of the indenter, and is a protruding part that pushes and double-opens the stage by moving the pressing part downward.

According to an eighth aspect of the present invention, there is provided the wafer manufacturing device of the seventh aspect, further including an adjuster that adjusts a vertical relative position between the indenter and the protruding part in the pressing part.

According to a ninth aspect of the present invention, there is provided the wafer manufacturing device of the seventh or eighth aspect, wherein the stage is freely double-opened and closed according to a movement amount of the protruding part.

According to a tenth aspect of the present invention, there provided the wafer manufacturing device of any one of the sixth to ninth aspects, wherein the indenter is tilted so that one end of the long portion of the indenter is positioned lower than the end thereof in a stationary state.

According to an eleventh aspect of the present invention, there is provided a wafer manufacturing method, for a wafer having two opposed lower and upper surfaces and an orientation flat (OF) formed by cleavage, including the steps of:

putting a scribe on the lower surface for forming OF, at least as a part of a planned cleavage line, by a scriber disposed in a belt-like gap at a joint of the double-open stage which can be freely double-opened, with a lower surface side of the wafer fixed to the stage; and double-opening the stage downward in conjunction with downward movement of the pressing part by moving the pressing part including an indenter having a long portion, which is freely swingable along the gap in a pendulum manner, from an upper side to a lower side of the stage after release of a fixture of the wafer, and cleaving the wafer by pressing the planned cleavage line on the upper surface opposed to the scribe put on the lower surface, by the long portion of the indenter.

According to a twelfth aspect of the present invention, there is provided the wafer manufacturing method of the eleventh aspect, wherein in the cleavage step, the stage is pushed and double-opened by a protruding part which is a part of the pressing part and protruding downward of the indenter, by moving the pressing part from an upper side to a lower side of the stage.

According to a thirteenth aspect of the present invention, there is provided the wafer manufacturing method of the twelfth aspect, wherein the cleavage step includes the steps of:

bringing the long portion of the indenter into contact with the upper surface;

pressing the planned cleavage line on the upper surface by the long portion of the indenter; and pushing and double-opening the stage by the protruding part.

According to a fourteenth aspect of the present invention, there is provided the wafer manufacturing method of the twelfth or thirteenth aspect, including the steps of:

closing the double-opened stage by moving the protruding part upward after the cleavage step; and performing the scribing step and the cleavage step to another wafer after the closing step.

According to a fifteenth aspect of the present invention, there is provided the wafer manufacturing method of any one of the twelfth to fourteenth aspects, further including the step of:

adjusting a vertical relative position between the indenter and the protruding part in the pressing part according to a thickness of the wafer, before the cleavage step.

According to a sixteenth aspect of the present invention, there is provided the wafer manufacturing method of the twelfth aspect, wherein in the scribing step, a scribe is put on a periphery of the lower surface which is one end of the planned cleavage line, and the indenter is tilted so that one end of the long portion of the indenter is positioned lower than the other end thereof in a stationary state, and in the cleavage step, a portion of the planned cleavage line on the upper surface opposed to the other end where the scribe is not put on the planned cleavage line on the lower surface, are first brought into contact with the indenter.

According to a seventeenth aspect of the present invention, there is provided a wafer group constituted by a plurality of wafers, with all of them having an orientation flat (OF), wherein the wafer group is constituted by 30 or more wafers, and for each wafer constituting the wafer group, a plot is formed in which the number of each wafer sequentially given from the side close to one end of the ingot is taken as X axis, and a concentration of a predetermined element in each wafer is taken as Y axis, and in this plot, the number of portions where continuity of the plot is lost, is a number equal to or less than 10% of a value obtained by adding the number of this portions to a total number of the wafers in the wafer group, and an increase/decrease value of the concentration of the predetermined element in a wafer of the next number is three times or less than the increase/decrease value assumed from the continuity of the plot, as compared with the wafer of an arbitrary number, and in an OF orientation accuracy of the wafer group represented by an angle, the OF orientation accuracy in each wafer is within ±0.010°.

Advantage of the Invention

According to the present invention, it is possible to provide a wafer group that facilitates securing uniformity of products manufactured from a wafer group whose composition varies among wafers.

Further, according to the present invention, it is possible to provide a technique of excluding uncertain factors in forming OF, and forming OF with extremely high probability and extremely high accuracy.

DETAILED DESCRIPTION OF THE INVENTION

Figure 1:
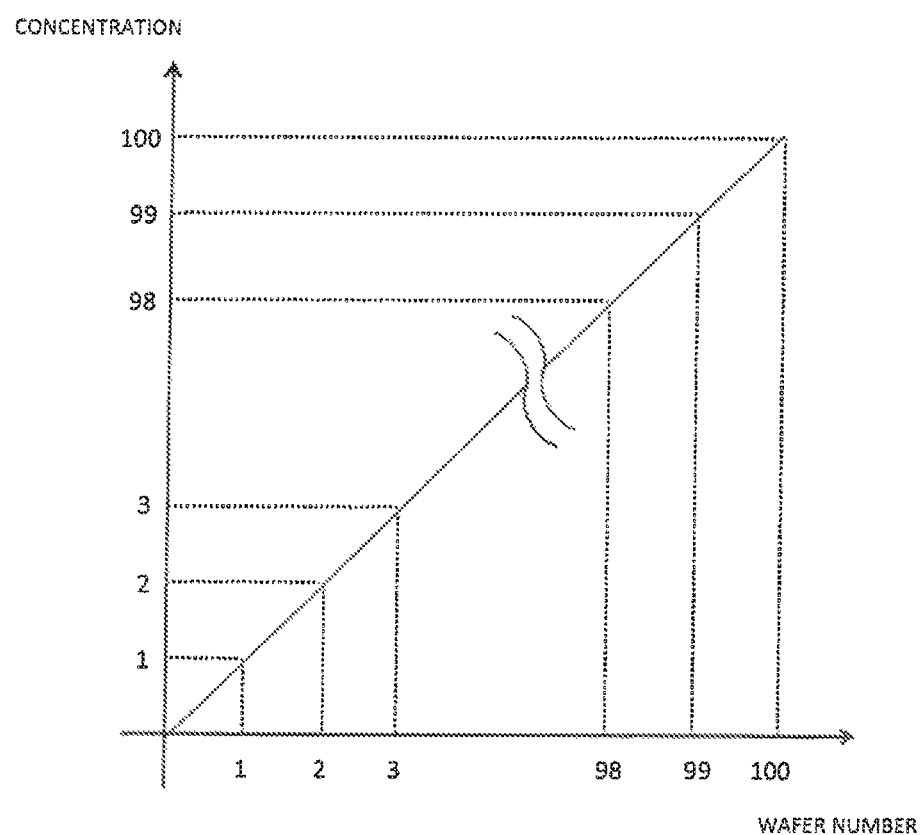
FIG. 1 is a graph showing a plot formed for each wafer constituting the wafer group, in which the number of each wafer sequentially given from the side close to one end of an ingot is taken as X axis, and a concentration of a predetermined element in each wafer is taken as Y axis.

Embodiments of the present invention will be described hereafter in the following order.
1. Wafer group
2. Wafer manufacturing device
  2-1. Stage
  2-2. Scriber
  2-3. Pressing part
  2-3-1. Pressing part body
  2-3-2. Swing part
  2-3-3. Indenter
  2-3-4. Protruding part (door opening mechanism)
  2-4. The other device configuration
3. Wafer manufacturing method
  3-1. Preparation step
  3-2. Scribing step
  3-3. Adjustment step
  3-4. Cleavage step
  3-4-1. Contact step
  3-4-2. Pressing step
  3-4-3. Door opening step
  3-5. Door closing step
  3-6. The other step
4. Effect of the embodiment
5. Modified example, etc.

In the present specification, " . . . to . . . " means a value not less than a predetermined value and not more than a predetermined value.

1. Wafer Group

The wafer group of this embodiment is constituted by a plurality of wafers obtained from the same ingot, with all wafers having an orientation flat (OF).

The wafer of this embodiment is not limited as long as it is a wafer having two opposed main surfaces and OF formed by cleavage. In other words, there is no particular limitation as long as it is a wafer made of a material capable of forming OF by cleavage.

As the wafer of this embodiment, a semiconductor wafer having a cleavage property can be mentioned. As a specific example thereof, known wafers including a cubic substrate such as a silicon wafer, GaAs wafer and InP wafer, hexagonal substrates such as a group III nitride wafer and sapphire substrates, are mentioned. Among these wafers, GaAs wafer is extremely easy to cleave, and it is difficult to obtain satisfactory OF orientation accuracy conventionally. Therefore, there is a great merit by adopting a technique of this embodiment, with GaAs wafer being focused.

In consideration of the ease of cleavage, in the wafer, the plane constituting OF is often defined by a standard such as SEMI. However, for example, in the cubic substrate, any one of (011), (0-1-1), (0-11) and (01-1) is preferable as the plane constituting OF.

Here, in the wafer group of this embodiment, the OF orientation accuracy of the wafer group is represented by an angle, and the OF orientation accuracy in each wafer satisfies a condition that the OF orientation accuracy of each wafer is within ±0.010°. This is a prerequisite condition in the wafer group of this embodiment.

By satisfying the abovementioned condition, it becomes possible to sufficiently satisfy the OF orientation accuracy which is getting stricter year by year. As a result, accuracy of an arrangement relation of constituent elements can be increased when applying processing to the wafer during manufacture of the semiconductor device, and it becomes possible to respond to miniaturization of the element and also it becomes possible to manufacture a high-quality semiconductor device or the like.

In addition, it is preferable to satisfy at least one of the following conditions.

(Condition 1) A value obtained by subtracting a minimum value from a maximum value of the OF orientation accuracy in each wafer, is 0.010° or less.

(Condition 2) The value obtained by subtracting an average value of the OF orientation accuracy of the wafer group from the maximum value of the OF orientation accuracy in each wafer, is 0.006° or less.

(Condition 3) A value obtained by subtracting the minimum value of the OF orientation accuracy in each wafer from the average value of the OF orientation accuracy of the wafer group, is 0.006° or less.

(Condition 4) A standard deviation of the OF orientation accuracy of the wafer group, is 0.0015 or less (specifically, 0.0010 to 0.0015).

By satisfying the abovementioned conditions, the OF orientation accuracy can be more satisfactorily satisfied. As a result, the accuracy of the arrangement relation of each constituent element can be further increased, and further a high-quality semiconductor device or the like can be manufactured.

Of course, it is acceptable to satisfy only the condition that is a major premise that the OF orientation accuracy of each wafer, that is, all wafers in the wafer group is within ±0.010°. In addition, after satisfying the condition that the OF orientation accuracy is within ±0.010°, each of the above-mentioned conditions 1 to 4 may be applied singularly, or a plurality of conditions 1 to 4 may be combined, and rather, by satisfying a plurality of combinations, the wafer group can be provided with extremely satisfactory OF orientation accuracy, and this is preferable.

When each of the abovementioned condition is focused, the fact that a conventional wafer group and the wafer group of the present invention are greatly different, and this will be described in the items of the embodiments described later.

Further, the wafer group of s embodiment is constituted by 70 or more wafers. If the wafer group is constituted by an extremely small number of wafers obtained from the same ingot, the continuity of composition and defects is almost eliminated in a case of the wafer group constituted by wafers cut out from disjoint portions in the ingot, and even if the wafer is attempted to be cut out collectively from a specific part of the ingot, this is remarkably difficult by the conventional method because there are uncertain factors in forming OF. As a result, in a conventional situation where there are uncertain factors in forming OF, the wafer group constituted by "70 or more wafers", having "satisfactory OF orientation accuracy as described above" and "obtained from the same ingot" does not yet exist or can not exist.

On the other hand, by satisfying a requirement such that the wafer group constituted by "70 or more wafers", having "satisfactory OF orientation accuracy as described above" and "obtained from the same ingot", the following effect can be exhibited.

First, it becomes possible to sufficiently satisfy the OF orientation accuracy which is getting stricter year by year. In addition, it becomes possible to satisfactorily maintain the continuity of the composition and the defect, because the abovementioned conditions are satisfied in the wafer group obtained from the same ingot. As a result, it becomes possible to make a match between the conditions for providing a different substance on the wafer and the continuity of the composition and the defect among wafers, and it becomes possible to suppress a variation in product performance of a semiconductor device or the like.

The above continuity can also be expressed as follows,

First, for each wafer constituting the wafer group, a plot is formed in which the number of each wafer sequentially given from the side close to one end of the ingot is taken as the X axis, and the concentration of a predetermined element in each wafer is taken as the Y axis.

The predetermined element may refer to a carrier, or may refer to any other element. In this embodiment, an example is given in which the predetermined element is a carrier and the concentration is a carrier concentration.

In this plot, by satisfying the following conditions, at least the continuity of the composition can be secured.

(Condition α) The number of portions where the continuity of the plot is lost, is the number of 10% or less of a value obtained by adding the number of this portion to a total number of wafers in the wafer group.

(Condition β) The increase/decrease value of the concentration of the predetermined element in a wafer of the next number is set to be three times or less of the increase/decrease value assumed from the continuity of the plot, as compared with the wafer of an arbitrary number.

Hereinafter, the condition α and the condition β will be described.

Figure 2:
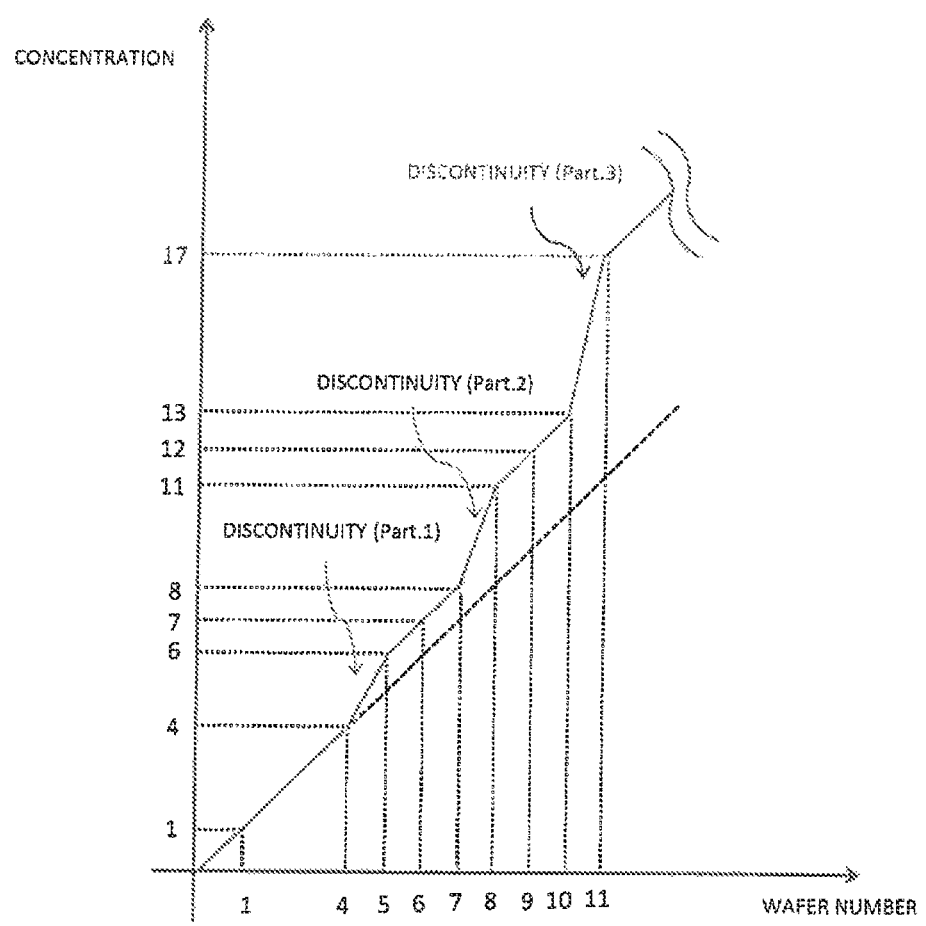
FIG. 2 is a graph in a case where there are wafers like missing teeth in FIG. 1.

First, regarding the condition α, "the portion where the continuity of the plot is lost", as its name implies, refers to a portion where a gradient is suddenly fluctuated as shown in FIG. 2, even though the continuity of the plot (for example, a predetermined gradient when the concentration is linearly increased) was maintained before this portion. Such a loss of continuity occurs due to the wafer in a state of missing teeth without forming satisfactory OF, after cutting the wafer from the same ingot. In other words, many wafers are excluded without forming satisfactory OF, even though originally the continuity is maintained among wafers at the time of being cut out from the ingot, and therefore when the wafer group is formed, the continuity of the composition and the defects is lost.

From another viewpoint, if the concentration is linearly varied, by excluding the "portion where the continuity of the plot is lost" shown in FIG. 2 and collecting only the portion having continuity, a straight line of the same gradient can be formed. The portion showing a behavior which is deviated from a straight line formed as described above, can also be referred to as "a portion where the continuity of a plot is lost". Even in a case where the concentration is varied in a curved manner, if only the portion having continuity is collected, a curve having substantially the same behavior can be formed. Therefore, this embodiment can also be applied to a case where the concentration is varied in a curved manner.

That is, in the condition α, "the number of portions where the continuity of the plot is lost" corresponds to the number of wafers that have become the wafer in a state of missing teeth when the wafer group is constituted after cutting the wafer from the same ingot, and corresponds to the number of discontinuous portions in FIG. 2. Further, the value obtained by adding the number of wafers becoming the wafer in a state of missing teeth and the number of wafers constituting the wafer group, is equal to the number of wafers cut out from the same ingot.

As a result, the number of portions where the continuity of the plot is lost, is divided by a value obtained by adding the number of this portion to a total number of the wafers in the wafer group, and the value thus obtained is further multiplied by 100, to thereby obtain approximate generation rate (%) of the wafer in a state of missing teeth. In this case, as the portion where the continuity of the plot is lost, even when a plurality of wafers in a state of missing teeth are continuously generated, it is counted as one portion. When a plurality of wafers in a state of missing teeth are continuously generated, treatment thereto is performed under the condition β described later.

In this embodiment, the incidence rate of the wafers in a state of missing teeth is preferably set to 10% or less. With this configuration, the continuity can be sufficiently secured for at least the composition among wafers. In addition, as will be described in the items of examples later, in comparative example 1 in which the wafer group was obtained from the same ingot, the yield is 88.9% under condition of ±0.010° as a reference (that is, the generation rate of wafers in a state of missing teeth is 11.1%). On the other hand, by setting "the number of portions where the continuity of the plot is lost, to equal to or less than 10% of the value obtained by adding the number of this portion to the total number of wafers in the wafer group", extremely significant differentiation can be achieved as compared with the conventional wafer group, and this can be realized as shown in example 1 described later.

The wafer in a state of missing teeth is generated not only because satisfactory OF cannot be formed, but also by excluding a wafer involving some trouble, or by performing sampling inspection on the wafer group. Particularly when sampling inspection is performed, the wafer near one end of the ingot, the wafer near the other end of the ingot, and the wafer near the center of the ingot, namely, three wafers in total are sampled and inspected in some cases. The condition α and the condition β described later are values in view of such circumstances. By the way, if the sampling inspection is always performed at the same position, uncertain factors cannot occur, and there is almost no inconvenience on the side of use.

The number of the portions where the continuity of the plot is lost, is preferably set to 8% or less, more preferably 4% or less of the number obtained by adding this portion to the total number of wafers in the wafer group.

Next, regarding the condition β, when the carrier concentration is linearly increased in the above-mentioned plot, the carrier concentration of the wafer of the next number is abruptly increased as compared with the wafers of an arbitrary number when the wafer in a state of missing teeth is generated. For example, as shown in FIG. 2, in a case that the gradient of the plot is 1, when the carrier concentration of the wafer of the next number should be increased by 1 but actually the carrier concentration has increased by 2 (discontinuity (part 1) in FIG. 2), one wafer is in a state of missing teeth. In other words, when the increase/decrease value at the discontinuity (part 1) FIG. 2 is twice the increase/decrease value assumed from the continuity of the plot, this indicates that one wafer is in a state of missing teeth at the discontinuity (part 1). Similarly, when the increase/decrease value at the discontinuity (part 2) in FIG. 2 is three times the increase/decrease value assumed from the continuity of the plot, two wafers are in a state of missing teeth at the discontinuity (part 2).

Namely, under the condition β, "the increase/decrease value of the concentration of a predetermined element in the wafer of the next number as compared with an arbitrary number of wafers, is three times or less (preferably twice or less) of the increase/decrease value assumed from the continuity of the plot". This indicates that three (preferably two) wafers are not consecutively in a state of missing teeth when OF is formed from each wafer before forming OF, and when the wafer group is obtained finally. In other words, this indicates that two wafers at most are consecutively in a state of missing teeth, and preferably, consecutive wafers in a state of missing teeth is not generated. This indicates that, as shown in the increase/decrease value at the discontinuity (part 3) in FIG. 2, there is no place where the increase/decrease value becomes 4 times the increase/decrease value assumed from the continuity of the plot. In other words, this indicates that only two wafers at maximum are consecutively missing even if the wafer in a state of missing teeth is consecutively generated when the wafer group is obtained from the same ingot.

It is also assumed that the plot is not a straight line as in the above example but a curve such as a quadratic curve. Even in that case, the abovementioned rule is applicable. Even if a predetermined element (for example, a carrier concentration caused by impurities) is originally varied within the ingot, its degree of variation is small. Therefore, even when the plot is not a straight line, the continuity of the composition can be sufficiently secured under the condition β given here.

Even if the wafers are obtained from the same ingot under the abovementioned conditions α and β, it is possible to guarantee that abrupt variation does not occur at least in composition among wafers, and it is possible to surely secure and grasp the continuity at least in the composition. As a result, various characteristics in the finally manufactured semiconductor device or the like can be further surely uniformized in each semiconductor device or the like.

2. Wafer Manufacturing Device

Figure 3:
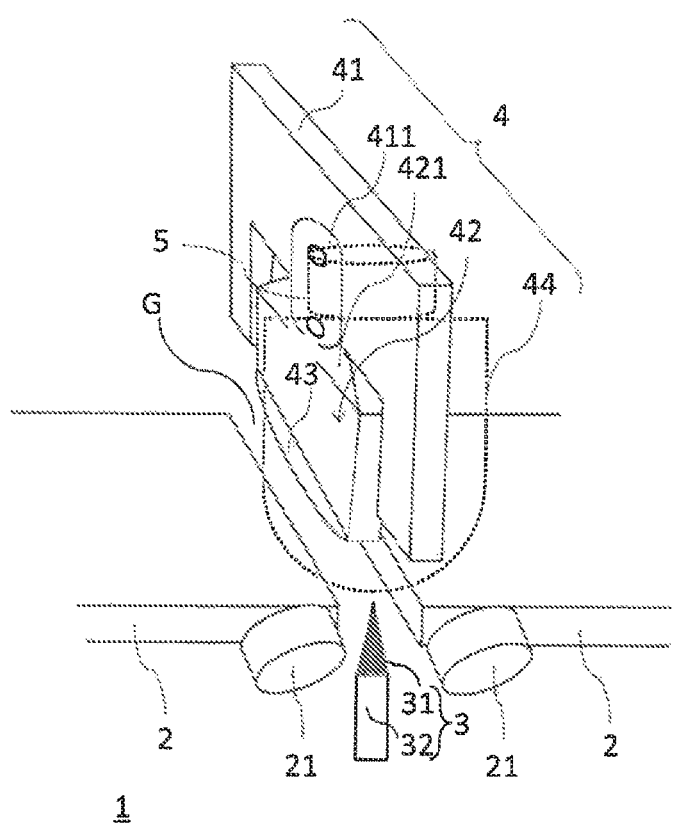
FIG. 3 is a schematic perspective view of a wafer manufacturing device according to an embodiment.
Figure 4:
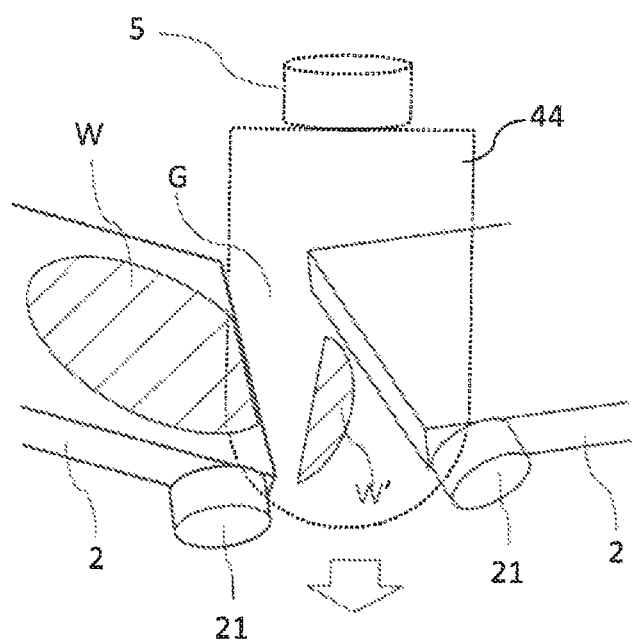
FIG. 4 is a schematic perspective view of a wafer manufacturing device according to an embodiment, and shows a state in which a wafer is cleaved and a protruding part pushes and double-opens a stage downward.
Figure 5:
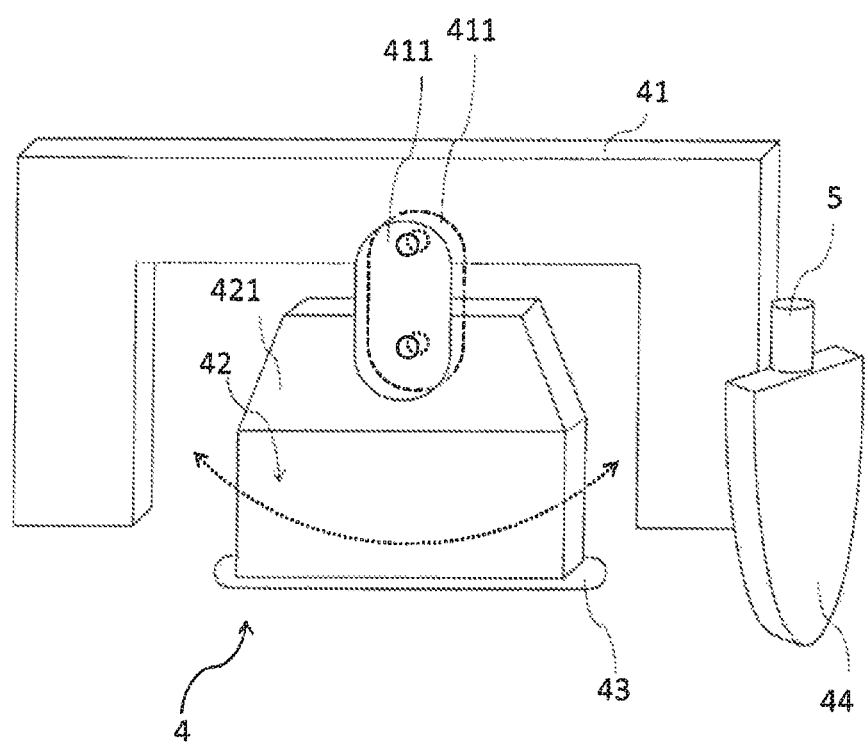
FIG. 5 is a schematic perspective view of a pressing part and an adjuster according to an embodiment.

Devices for manufacturing the wafer group will be described hereafter, with reference to FIG. 3 to FIG. 6. FIG. 3 is a schematic perspective view of the wafer manufacturing device according to an embodiment. For convenience of explanation, a protruding part 44 and an adjuster 5 are indicated by dotted lines. FIG. 4 is a schematic perspective view of a wafer manufacturing device according to an embodiment, and shows a state in which a wafer is cleaved and the protruding part 44 pushes and double-opens a stage 2 downward, FIG. 5 is a schematic perspective view of a pressing part 4 and an adjuster 5 according to an embodiment.

Figure 6:
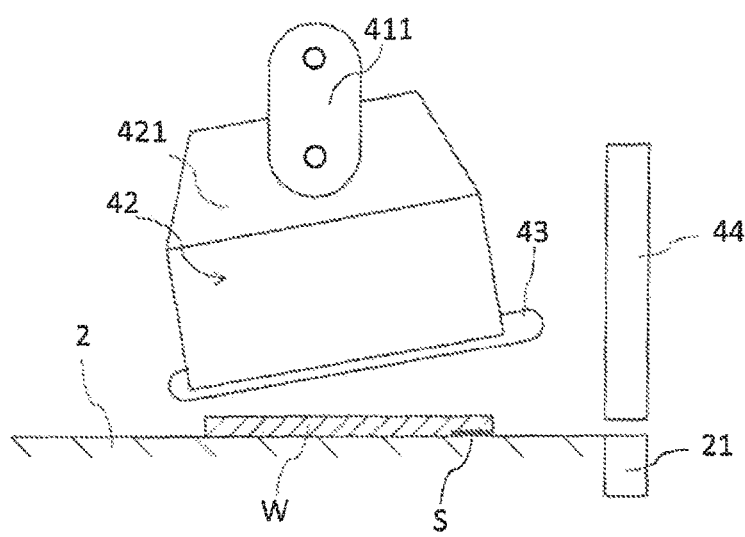
FIG. 6 is a schematic cross-sectional view showing a state in which the wafer is pressed by an indenter of this embodiment, wherein (a) shows a state before pressing, and (b) shows a state during pressing.
Figure 6:
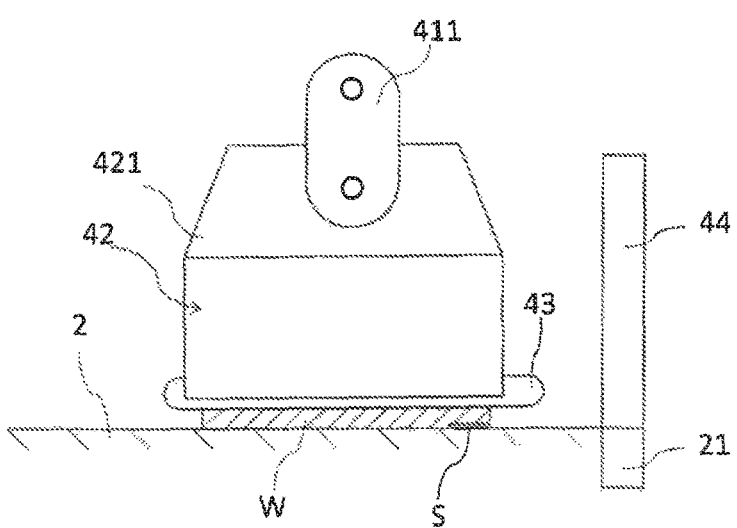

FIG. 6 is a schematic cross-sectional view showing a state in which the wafer is pressed by an indenter 43 of this embodiment, wherein (a) shows a state before pressing, and (b) shows a state during pressing.

A wafer W (hereinafter abbreviated as a wafer) of the wafer manufacturing device 1 (in other words, a wafer cleaving device) according to this embodiment has two opposed main surfaces. In this embodiment, for the convenience of the explanation, the side with the scribe S put thereon is set as a lower surface, and the side pressed by an intender 43 is set as an upper surface, in the two opposed main surfaces. More specifically, as will be described in detail later, a direction in which a fragment W' of the wafer generated after forming OF falls from a gap G of the stage 2 (that is, the direction of a ground out of the top and the ground) is defined as a downward direction.

Also, the upper surface of the wafer and the lower surface of the wafer may be simply referred to as an "upper surface" or a "lower surface" in some cases.

2-1. Stage 2

As shown in FIG. 3, the stage 2 of this embodiment is a portion where a work for making a scratch on a cut portion of the wafer for forming OF (to put a so-called scribe S thereon), or a cleavage is performed. Also, the stage 2 of this embodiment which can freely switch between fixing the wafer and releasing the fixture, is used.

As a technique of fixing the wafer, a known technique may be used, and for example, the manufacturing device may have a configuration that allows vacuum suction and release of the wafer on the stage 2.

Here, in this embodiment, as shown in FIG. 4, the stage 2 which can be freely opened is used. As will be described in detail later, by adopting this configuration, it is possible to suppress application of a load to one place when cleaving the wafer, and it is also possible to quickly drop the fragment W' of the wafer downward after cleaving the wafer.

In the stage 2 of this embodiment, a belt-like gap G is provided at a joint of the double-open stage 2. As described above, the gap G has a role of quickly dropping the fragment W' of the wafer, and also has a role of a space for disposing the scriber 3 described later. The width of the gap G is not particularly limited as long as it is a width that allows the scriber 3 to be disposed therein and has a width that allows stable cleavage to be performed as described in detail later. As a specific numerical value, the width is preferably 3.0±0.1 mm.

Further, in this embodiment, the stage 2 may be configured so that an entire body is double-opened, or a part of the stage 2 may be double-opened as far as it does not greatly affect at least cleavage of the wafer. Also, the door portion of the stage 2 to be double-opened may have the same size and shape (so-called double door), or may have different sizes and shapes (so-called parent-child door).

Also, as will be described later in detail, as a configuration of the double door of the stage 2, it may have a configuration that opens at least downward. Also, it is also possible to adopt a configuration that when one door is pushed and opened, the other door is also opened in conjunction with each other, due to use of a spring member and a rigid member for example. With this configuration, the door which is not in contact with the protruding part 44 can also be pushed and opened, because one of the doors is pushed and opened by the protruding part 44 described later, and as a result, the stage 2 can be double-opened. Of course, both doors may be pushed and opened by the protruding part 44 described later.

Further, it is preferable that the stage 2 can be freely opened and closed according to an amount of a movement of the protruding part 44. As shown in FIG. 4 (by white arrows in FIG. 4), when the protruding part 44 moves downward and contacts the stage 2 to push and open the stage 2, and thereafter moves upward and separated from the stage 2, it is preferable that the stage 2 is automatically closed by a spring hinge or the like for example. With this configuration, it is not necessary to return the stage 2 to an initial state every time, and cleavage can be performed continuously.

2-2. Scriber 3

The scriber 3 of this embodiment is a portion for putting a scribe S on the lower surface of the wafer for cleaving the wafer. The configuration of the scriber 3 may be arbitrary as long as it has a portion capable of performing scribing of the scribe S. For example, the scriber 3 may be formed by providing a scribing pen 31 and a support table 32 supporting the scribing pen 31 in the manufacturing device.

As the scribing pen 31, a known one may be used according to a type of the wafer, and for example, the scribing pen 31 made of diamond may be used. Further, a shape and a size of the scribing pen 31 may be appropriately changed according to the type of the wafer and the shape of the scribe S. For example, it is preferable to perform scribing of the scribe S having a length of 4 to 6 mm, and in this case, the scribing pen preferably has a shape capable of performing scribing of the scribe S with a depth of 40 to 50 μm. The scribing pen also has a shape capable of performing scribing of the scribe S with a width of about 50 μm.

Here, in this embodiment, the scriber 3 is disposed in a belt-like gap G at a joint of the double-open stage 2 and configured to be movable freely along the gap G. To give a specific configuration, a rail is provided just under the gap G at the joint of the double-open stage 2, and the support table 32 for supporting the scriber 31 is disposed on the rail, and the support table 32 is set movable in a direction parallel to the gap G. It is preferable to employ a configuration in which the support table 32 is also movable in a vertical direction. With this configuration, when the scribe S is put on the lower surface of the wafer, it is possible to form the scribe S only on a part of the wafer from below, and it is possible to reduce a risk of causing unnecessary cleavage by scratching the wafer with scribe S.

For the preferred method for putting the scribe S and a preferred cleaving method, see <3. Wafer manufacturing method>.

2-3. Pressing Part 4

The pressing part 4 of this embodiment is a Portion for cleaving the wafer starting from the scribe S on the lower surface of the wafer by pressing the upper surface of the wafer, and has a configuration such that it is disposed above the stage 2 and movable in the vertical direction.

As a specific configuration of the material, size, and shape, etc. of the pressing part 4, it may be a known one as long as it has the above function. Hereinafter, one specific example of the pressing part 4 is shown in FIG. 5.

The pressing part 4 of this embodiment broadly includes the following configurations.

The pressing part body 41 connected to the wafer manufacturing device 1

A swing part 42 which is a plate-like member to be fitted into the opening portion of the pressing part body 41

An indenter 43 used for pressing the upper surface of the wafer by the downward movement of the pressing part 4

A protruding part 44 that protrudes downward of the indenter 43 and pushes and double-opens the stage 2 by moving the pressing part 4 downward Each configuration will be described hereafter.

2-3-1. Pressing Part Body 41

The pressing part body 41 is connected to the wafer manufacturing device 1, and moves in the vertical direction, upon receiving an instruction from a controller (not shown) of the wafer manufacturing device 1. Consequently, the indenter 43 and the protruding part 44 attached to the pressing part body 41 are also moved in the vertical direction.

The pressing part body 41 of this embodiment is a plate-like member. When a free-standing state on a bottom surface sandwiched between two main surfaces of the plate-like member is viewed, the pressing part body 41 is the plate-like member having an opening at a lower side, and has a shape of substantially a U-shaped letter with its lower part opened. The swing part 42 of the plate member is accommodated in the opening. Then, the indenter 43 is fixed under the swing part 42.

On the top of the opening of the pressing part body 41, metal fittings 411 on a thin plate for fitting the swing part 42, are extended downward and attached to two main surfaces of the pressing part body 41. The swing part 42 is fitted between the two metal fittings 411. Holes for fixing them with screws or the like are provided in these two metal fittings 411. By fitting the swing part 42 and inserting screws or the like into the two holes, the swing part 42 is hung by the screws or the like. As a result, the swing part 42 and the indenter 43 fixed to the swing part 42 can swing. In addition, the swing motion is such that the swing part 42 can move only in a thickness direction portion of the pressing part body 41 by the two metal fittings 411 attached to the pressing part body 41. Therefore, a swing direction of the swing part 42 is limited to a left and right direction (eventually, the direction in which the gap G of the stage 2 is extended and a direction parallel to a planned cleavage line of the subsequent wafer) (shown by dotted line arrow in FIG. 5).

2-3-2. Swing Part 42

The swing part 42 of this embodiment is a plate-like member to be fitted into the opening portion of the pressing part body 41. A metal part 421 for connecting with the two metal fittings 411 is provided on an upper portion in the right and left direction with respect to both surfaces of the swing part 42. Then, a bottom surface of the swing part 42 which is a lowermost end has a long shape for fixing the indenter 43. As a means for fixing the indenter 43 to the long shape portion, a known one may be used, and a double-sided tape or an adhesive agent may be used as appropriate. As an angle for enabling a free swing, any one can be used as long as it is possible to exclude uncertain factors in forming OF of the wafer and it is possible to form OF satisfactorily and reliably.

2-3-1. Intender 43

The indenter 43 of this embodiment is the one having the long portion that presses the upper surface of the wafer, and is disposed along the gap G of the stage 2 and above the gap G. Further, the indenter 43 is freely swingable along the gap G in a pendulum manner (shown by dotted arrow in FIG. 5).

A configuration of the intender 43 will be described hereafter.

First, as the indenter 43, any material, size, or shape may be used as long as it has the abovementioned configuration.

For example, the indenter 43 may be made of resin. As the resin, a known resin may be used, and for example a urethane resin may be used.

Further, it is sufficient if the indenter 43 has the long shape capable of sufficiently covering the pressing over the cleavage planned line, and it is sufficient if the indenter 43 has a shape longer than the cleavage planned line.

Further, as a place for disposing the intender 43 (a place for disposing the swing part 42), as described above, the intender 43 is disposed in the pressing part 4 which is disposed above the stage 2, so that the long portion of the indenter 43 is parallel to the gap G of the stage 2 and directly above the gap G. By employing such a configuration, a planned cleavage line on the upper surface opposite to the scribe S put on the lower surface, is positioned directly below the long portion of the indenter 43 because the scriber 3 is disposed in the gap G of the stage 2. When the pressing part 4 is moved downward in this state, the long portion of the indenter 43 can press the planned cleavage line on the upper surface so as to trace the planned cleavage line.

Further, the indenter 43 of this embodiment is freely swingable along the gap G in a pendulum manner together with the swing part 42 which is a fixing destination. By thus making the indenter 43 freely swingable along the gap G in a pendulum manner, the following effects are obtained. Explanation will be given hereafter based on the knowledge.

First, a reason why cleavage cannot be satisfactorily performed to the wafer is that a load is concentrated on one inappropriate place and cleavage occurs at a part deviated from the plane on which cleavage is planned. It is almost impossible to completely eliminate the above situation because a worker is a human being.

On the other hand, another reason why cleavage cannot be satisfactorily performed to the wafer is that the load is simultaneously applied to the entire planned cleavage line of the wafer. This is a fact that should be an advantage unique to machines if the work is done by machines, but conversely, this is a drawback. The reason is that when the load is simultaneously applied to the entire planned cleavage line of the wafer, the cleavage simultaneously occurs at different places pressed by the indenter 43 at the time of the cleavage. As a result, not necessarily one cleavage planes is formed, and it is easy to form disjoint cleavage planes.

The above knowledge is obtained only when the present inventors actually cleaved 13,000 or more wafers.

As a result, the inventors of the present invention achieve an idea of adopting the freely swingable indenter 43 in a pendulum manner. With this configuration, even if the indenter 43 contacts the upper surface of the wafer and pressing is started, the load is not concentrated only on the contact portion because the indenter 43 is freely swingable in a pendulum manner. After the indenter 43 contacts the upper surface of the wafer, the indenter 43 is brought into contact with the upper surface so as to trace the planned cleavage line on the upper surface of the wafer. Then, the pressing force by the indenter 43 becomes stronger as it is, and with the scribe S put on the lower surface of the wafer as a start point, the wafer is cleaved and OF is formed.

In the above configuration, for accuracy of doing a work by a machine, a force can be adjusted so as not to concentrate a load on one place, which is unique to human beings during doing the work. In other words, this is a configuration in which an advantage of machines and an advantage of human beings are combined and realized.

As a result, it is possible to exclude uncertain factors in forming OF and possible to form OF in an extremely satisfactory and extremely reliable manner, and also it is possible to remarkably reduce the number of wafers in a state of missing teeth in the wafer group formed from the same ingot.

As shown in FIG. 6(*a*), it is highly preferable to tilt the indenter 43, in such a manner that one end of the long portion of the indenter 43 is positioned lower than the other end thereof in a stationary state. As will be described in detail later, the portion of the planned cleavage line on the upper surface of the wafer opposed to the other end where the scribe S is not put on the cleavage planned line, can be first brought into contact with the intender 43. Then, when the pressing part 4 is further moved downward, as shown in FIG. 6(*b*), the indenter 43 sequentially presses the upper surface of the wafer so as to trace the planned cleavage line from an upper surface portion opposed to the lower surface on which the scribe S is not formed. As a result, the load can be applied to the upper surface of the wafer in a well-balanced manner, the uncertain factors can be further excluded in forming OF, and OF can be more satisfactorily and reliably formed.

Incidentally, an arbitrary method may be used as a specific tilting method of the indenter 43, and there is a method as follows: one side of the swing part 42 is made heavy, or a fixture place of the swing part 42 in the pressing part body 41 is disposed closer to a direction opposite to the side where the intender 43 is tilted, or the like.

2-3-2. Protruding Part 44 (Door Opening Mechanism)

The protruding part 44 of this embodiment is also referred to as a door opening mechanism. In this embodiment, the protruding part 44 is provided as a part of the pressing part 4, and is provided protruding downward of the intender 43, at least at one side of the pressing part 4 (preferably at a side where the scribe S is put on the cleavage planned line, and at one end side positioned in the upper part of the tilted intender 43). The protruding part 44 has a function of pushing and double-opening the stage 2 by moving the pressing part 4 downward. In order to make contact with the protruding part 44, protrusions 21 may be provided on both doors of the stage 2.

The protruding part 44 protrudes downward of the indenter 43. As result, simultaneously with or before the indenter 43 is brought into contact with the planned cleavage line on the upper surface of the wafer, the protruding part 44 is brought into contact with the stage 2. With this configuration, at almost the same timing as when the indenter 43 presses the upper surface of the wafer, the stage 2 is double-opened downward. Thereby, the following effect can be exhibited.

First, by double-opening of the stage 2 downward when the intender 43 presses the upper surface of the wafer, the load is applied not only in the vertical direction but also in the horizontal direction within the planned cleavage line. Then, the wafer is deflected to open the wound of the scribe S, and the scribe S can be surely used as a start point of the cleavage. Then, by tilting the intender 43 as described above, the uncertain factors are excluded in a direction of a progress of the cleavage extending from the scribe S as the start point of the cleavage to an opposite side portion thereof, because a pressure equal to or higher than a pressure required for the cleavage has already been applied along the planned cleavage line from the opposite side of the scribe S at a moment such a pressure is applied to the scribe S. According to this embodiment, the door of the stage 2 is opened in conjunction with the movement of the pressing part 4 downward, and therefore the uncertain factors can be excluded in forming OF, and OF can be formed extremely satisfactorily and extremely reliably.

Next, by double-opening the stage 2 downward, it becomes possible to quickly drop the fragment W' of the wafer which is unnecessary after cleavage, to the lower side of the stage 2 (shown by hollow arrow in FIG. 4). If the fragment W' of the wafer is remained even after cleavage, there is a possibility that the wafer may be scratched due to the fragment W' of the wafer, even if OF is satisfactorily formed. It is acceptable for the fragment W' of the wafer to be dropped in the gap G at the joint of the double-open wafer or other places, or a mechanism of suctioning the fragment W' of the wafer may be separately provided.

A protrusion degree of the protruding part 44 may be arbitrary as long as the abovementioned effect can be exhibited, but it is preferable to make the protruding part 44 protrude downward beyond a lowermost end of the indenter 43 by not less than a thickness added with a thickness of the wafer. With this configuration, it is ensured that the stage 2 is pushed and opened before the wafer is cleaved, and the load as described above can be dispersed. At this time, it is preferable that a height difference between the protruding part 44 and the indenter 43 is expressed by [wafer thickness to be cleaved]+[0.05 to 0.15 mm]. Such a height difference varies depending on the thickness and material of the wafer to be cleaved, and for example, it is preferable to make it larger (deflect the wafer greatly) as the pressure required for cleavage is larger.

2-4. Adjuster 5

In this embodiment, preferably, an adjuster 5 is further provided, for adjusting a vertical relative position between the indenter 43 and the protruding part 44 in the pressing part 4. The adjuster 5 of this embodiment is provided at one side of the left and right sides of the pressing part body 41, and has a configuration capable of adjusting the protruding degree of the protruding part 44 by rotating a dial knob. In this embodiment, "the vertical relative position between the indenter 43 and the protruding part 44 in the pressing part 4" means the relative position between the lowermost end of the indenter 43 and the lowermost end of the protruding part 44.

For example, when the wafer is thick, there is a possibility that the protruding part 44 is brought into contact with the stage 2 after cleaving the wafer, unless the protruding part 44 is protruded largely. However, owing to the adjuster 5, it is possible to freely adjust the timing at which the indenter 43 presses the upper surface of the wafer and the timing at which the protruding part 44 pushes and opens the stage 2. As a result, the uncertain factors can be excluded in forming OF, and OF can be formed satisfactorily and reliably, and it is possible to remarkably reduce the number of wafers in a state of missing teeth in the wafer group formed from the same ingot.

2-5. Other Device Configuration

Of course, the wafer manufacturing device 1 of this embodiment may have a configuration other than the above listed configurations. For example, a mechanism of transferring the wafers and a mechanism of aligning the wafers before performing scribing of the scribe S (both not shown) may be provided. For matters not mentioned above in particular, known configurations may be adopted.

3. Wafer Manufacturing Method

A wafer manufacturing method of this embodiment will be described hereafter. However, a part of the wafer manufacturing method is described in the abovementioned <2. Wafer manufacturing device>, and therefore overlapping portions will be omitted.

3-1. Preparation Step

In this step, preparation for carrying out the wafer manufacturing method of this embodiment is performed. For example, the abovementioned wafer is prepared and set on the stage 2.

As described above, the indenter 43 is tilted so that one end of the long portion of the indenter 43 is positioned lower than the other end thereof in a stationary state.

3-2. Scribing Step

In this step, the scribe S for forming OF is put on the lower surface as at least a part of the planned cleavage line, by the scriber 3 disposed in the belt-like gap G at a joint of the double-open stage 2, with the lower surface side of the wafer fixed to the freely double-openable stage 2.

In this embodiment, the scribing step is performed, with the wafer fixed to the stage 2. Thereby, the scribe S can be surely put on the planned cleavage line on the lower surface of the wafer. Fixing of the wafer may be performed by turning on a vacuum suction function by the controller of the wafer manufacturing device 1.

A place for putting the scribe S thereon, may be arbitrarily selected. For example, the scribe S may be put on an entire planned cleavage line on the lower surface of the wafer, or the scribe S may be put on one end or both ends of the planned cleavage line.

However, in this step, it is preferable to put the scribe S only on the periphery of the lower surface of the wafer which is one end of the planned cleavage line. Thereby, in a cleavage step (specifically, a contact step) described later, as shown in FIG. 6(*a*), the portion of the planned cleavage line on the upper surface of the wafer opposed to the other end where the scribe S is not put on the cleavage planned line on the lower surface of the wafer, can be first brought into contact with the intender 43. By adopting this method, it is possible to prevent the load from concentrating on the portion which is brittle due to the scribe S, thereby making it possible to suppress generation of an unintended cleavage before the load is applied to the entire planned cleavage line. That is, as shown in FIG. 6(*b*), the indenter 43 sequentially presses the upper surface of the wafer so as to trace the planned cleavage line from an upper surface portion opposed to the portion where the scribe 5 is not formed on the lower surface, to thereby make it possible to apply the load to the upper surface of the wafer in a well-balanced manner. As a result, the force can be further adjusted so as not to concentrate a load on one place, which is unique to human beings during doing the work.

3-3. Adjustment Step

An adjustment step of adjusting the vertical relative position between the indenter 43 and the protruding part 44 in the pressing part 4 according to a thickness of the wafer, is performed before a cleavage step described later. Inventors of the present invention have been studying on generalized conditions (for example, conditional expressions) for performing adjustment in the adjustment step. In this specification, various conditions for the examples are described in the items of the examples described later.

Of course, this step may be carried out as the above mentioned preparation step.

3-4. Cleavage Step

In this step, as shown in FIG. 4, the stage 2 is double-opened downward in conjunction with a downward movement of the pressing part 4 by moving the pressing part 4 including the indenter 43 having a long portion, which is freely swingable along the gap in a pendulum manner, from an upper side to a lower side of the stage after release of a fixture of the wafer, and cleaving the wafer by pressing the planned cleavage line on the upper surface opposed to the scribe S put on the lower surface, by the long portion of the indenter 43.

One of the major characteristics of this step is that, reversely to the scribing step, the cleavage step is performed after release of a fixture of the wafer. If this step is performed with the wafer fixed similarly to the scribing step, there is no escape place of the load when pressed by the indenter 43. Then, as described above, the load is applied to one place of the wafer, which may cause unintended cleavage. On the other hand, by performing this step with the fixture of the wafer released, the wafer can be freely moved in accordance with the stress from the start point to the end point during cleaving the wafer, thus making it possible to suppress a situation that the load is applied to one place of the wafer.

Note that this step broadly includes the following steps.
A contact step of bringing the long portion of the indenter 43 into contact with the upper surface of the wafer
A pressing step of pressing the planned cleavage line on the upper surface of the wafer by the long portion of the indenter 43
A door opening step of pushing and double-opening the stage 2 by the protruding part 44

By performing the above steps almost at the same time in a short time, the effect of this embodiment is exhibited. Explanation will be given hereafter.

3-4-1. Contact Step

This step is the step of bringing the long portion of the intender 32 into contact with the upper surface of the wafer as its name implies. According to a preferable embodiment, the portion of the planned cleavage line on the upper surface of the wafer opposed to the other end where scribe S is not put on the planned cleavage line on the lower surface of the wafer, are first brought into contact with the intender 43, by moving the pressing part 4 downward (FIG. 6(a)). Then, the indenter 43 sequentially presses the upper surface of the wafer so as to trace the planned cleavage line from the upper surface portion opposed to the lower surface on which the scribe S is not formed (FIG. 6(b)).

Before contact of the indenter 43, it is preferable to stop the operation once at a position of 0.05 to 0.20 mm (preferably 0.15 mm) above the planned cleavage line on the upper surface of the wafer. By performing this step from this position, it is possible to appropriately apply the load to the wafer without too much momentum and too weak momentum.

3-4-2. Pressing Step

Then, the intender 43 is sequentially brought into contact with the other end of the planned cleavage line so as to trace the planned cleavage line. At the same time, pressing on the upper surface of the wafer is performed, and cleavage occurs with the scribe S on the lower surface of the wafer as a start point.

3-4-3. Door Opening Step

At the same time that this cleavage occurs, the stage 2 is double-opened downward by the protruding part 44. By doing so, it is possible to suppress the application of the load to one place during cleaving the wafer, and in addition, it is possible to quickly drop the fragment W' of the wafer downward after cleavage.

The scriber 3 may be retracted to an end of the gap G at the time of performing the abovementioned each step.

Through the above steps, the wafer is cleaved extremely satisfactorily and reliably along the planned cleavage line. In addition, it is possible to exclude uncertain factors in forming OF.

3-5. Door Closing Step

In this step, the double-opened stage 2 is closed by returning the pressing part 4 (or protruding part 44) upward.

3-6. The Other Step

When OF is formed for another wafer continuously, the abovementioned each step may be performed to another wafer after the door closing step. Further, smoothing of OF may be performed after OF is formed, and In addition, various well-known processing necessary for manufacturing wafers may be performed.

4. Effect of this Embodiment

According to this embodiment, the following effects can be exhibited in addition to the abovementioned effects.

First, it becomes possible to sufficiently satisfy OF orientation accuracy which is getting stricter year by year. As a result, it is possible to increase the accuracy of the arrangement relation of constituent elements when processing is performed to the wafer in manufacturing a semiconductor device, and possible to respond to miniaturization of the element, and possible to manufacture a high quality semiconductor device, etc.

Further, as each wafer is manufactured from the ingot, fluctuation of the carrier concentration is inevitable. However, according to the wafer group of this embodiment, for example, continuity of the carrier concentration is maintained, and such a continuity can be grasped in advance. Based on a result of grasping the continuity, various characteristics of the finally manufactured semiconductor device or the like can be uniformized in each semiconductor device or the like.

Further, with the abovementioned configuration, for accuracy of doing a work by a machine, the force can be adjusted so as not to concentrate a load on one place, which is unique to human beings during doing the work, and it is possible to combine an advantage of machines and an advantage of human beings.

As a result, it is possible to exclude uncertain factors in forming OF and possible to form OF in an extremely satisfactory and extremely reliable manner, and as a result, it is possible to remarkably reduce the number of wafers in a state of missing teeth in the wafer group formed from the same ingot.

As described above, according to this embodiment, it is possible to provide a wafer group that facilitates securing uniformity of products manufactured from the wafer group whose composition varies among wafers.

Further, according to this embodiment, it is possible to provide a technique of excluding uncertain factors in forming OF, and a technique of forming OF with extremely high probability and extremely high accuracy.

5. Modified Example, Etc.

The technical scope of the present invention is not limited to the abovementioned embodiments, but includes various modifications and improvements within the scope of deriving the specific effects obtained by the constituent features of the invention and combinations thereof.

(Wafer Group)

In this embodiment, the following phrase is used: "the wafer is cut from the same ingot". On the other hand, instead of using such a phrase, it is also possible to use the following phrase (condition γ) in order to guarantee at least the continuity of the composition.

(Condition γ) A plot is formed for each wafer constituting the wafer group in which the number of the wafers given in an order of decreasing concentration of a predetermined element in each wafer is taken as the X axis, and the concentration of the predetermined element in each wafer is taken as the Y axis, and in this plot, the number of portions where the continuity of the plot is lost, is the number of 10% or less of the total number of wafers in the wafer group, and the increase/decrease value of the concentration of the predetermined element in the wafer of the next number is set to be three times or less of the increase/decrease value assumed from the continuity of the plot, as compared with the wafer of an arbitrary number.

Then, by satisfying the abovementioned conditions relating to OF (for example, OF orientation accuracy is within ±0.010°), the problem of the present invention can be solved.

Under the abovementioned condition, the continuity of composition is guaranteed, and therefore it is preferable that the number of wafers constituting the wafer group is set to 70 or more, but the number of wafers is not particularly limited thereto. However, in most cases, the wafer group is preferably constituted by 30 or more wafers, in consideration of a point that a sampling test is performed by selecting three wafers, and in consideration of a point that the number of portions where the continuity of the plot is lost, is the number of 10% or less of the total number of wafers in the wafer group.

Further, the conditions α', β' and γ' in which "density" in the condition γ (more specifically the conditions α and β) is replaced with "defect density", may be used instead of the conditions α to γ. Further, these conditions α to γ, and α' to γ' may be combined as appropriate.

(Scriber 3 and the Scribing Step)

This embodiment shows an example of providing the scriber 3 and the scribing step. On the other hand, this embodiment is also applicable to the wafer to which the scribing of the scribe S has already been performed. That is, in the wafer manufacturing device 1 of this embodiment, it is possible to exclude uncertain factors in forming OF and possible to form OF satisfactorily and reliably by appropriately putting the scribe S even when the scriber 3 is not provided. This also applies to the scribing step in the wafer manufacturing method. However, it is a matter of course that there is a great advantage in that the scribing step and the cleavage step can be performed automatically in one device, and an example of providing the scriber 3 and the scribing step is preferable.

(Indenter 43)

This embodiment shows an example of forming the swing part 42 and the indenter 43 separately. However, both of them may be formed integrally. For example, the swing part 42 itself may be formed as the indenter 43. More specifically, a pendulum type swing mechanism may be provided in the pressing part main body 41, and the pressing part main body 41 itself may be the indenter 43. In this case, the long portion for pressing the upper surface of the wafer in the indenter 43 may be a bottom portion sandwiched between two main surfaces of for example the plate-like swing part 42.

(Door Opening Mechanism)

This embodiment shows an example in which the door opening mechanism is the protruding part 44 which is a part of the pressing part 4. On the other hand, a door opening mechanism may be provided in the wafer manufacturing device 1 separately from the pressing part 4. For example, it is acceptable to adopt a configuration in which the stage 2 is double-opened downward according to the movement amount of the pressing part 4 by the controller of the wafer manufacturing device 1. In this case, instead of rotating the dial knob, the adjuster may perform numerical control under control of the controller.

EXAMPLES

Next, the present invention will be described in detail by showing examples. Of course, the present invention is not limited to the following examples.

Example 1

In this example, OF was formed on each wafer by using the wafer manufacturing device 1 described in the abovementioned embodiment, and finally, the wafer group was manufactured. Hereinafter, each condition will be described, but the content is the same as the content described above in the preferable example unless otherwise is specified.

(Preparation Step)

In this step, first, 41 Si-doped GaAs ingots were prepared. Then, the number of wafers cut out from one ingot was set to 76 to 170 wafers. The thickness of one wafer was set to 0.710 mm. A urethane rod produced by MISUMI (CXFAN-D6-L80) was fixed to the bottom portion (long portion) of the plate-like swing part 42, as the indenter 43.

(Scribing Step)

In this step, first, the wafer was vacuum-adsorbed on the stage 2. Thereafter, the scribe S was put on the lower surface of the wafer by the scriber 3. A replacement core (ABR-0011-1) of D-POINT produced by Ogura Jewel Seiki Kogyo Co., Ltd. was used as a scribing pen 31 in the scriber 3. The scribing pressure applied to the lower surface of the wafer from below was set to 0.330 MPa. The scribe S was put only on the periphery of the wafer at one side of the wafer's planned cleavage line. The length of the scribe S was set to 4 mm.

Further, in this step, the indenter 43 was tilted in advance in the preparation step so that one end of the indenter 43 approached the upper surface of the wafer, in the upper part of the portion of the planned cleavage line on the upper surface of the wafer opposed to the other end where the scribe S is not put on the cleavage planned line on the lower surface of the wafer. Specifically, the indenter 43 was tilted so that a difference in height of 3 mm would be formed between both ends of the indenter 43.

(Adjustment Step)

In this step, adjustment was made so that the lowermost end of the protruding part 44 (cam) was further protruded downward from the lowermost end of the indenter 43 by [wafer thickness to be cleaved]+0.15 mm.

(Cleavage Step)

In this step, first, fixture of the wafer is released after performing vertical scribing of the scribe S. At this time, the vertical relationship between the two main surfaces of the wafer was left intact.

Thereafter, the pressing part 4 was moved downward from 0.15 mm above the stage 2 at a speed of 35 to 65 mm/s. Then, the stage 2 is double-opened downward in conjunction with the downward movement of the pressing part 4, and the planned cleavage line on the upper surface opposite to the scribe S put on the lower surface was pressed by the long portion of the indenter 43 to thereby cleave the wafer. Thus, a wafer having an OF formed thereon was manufactured.

(Door Closing Step)

Thereafter, the pressing part 4 is returned upward, and the door of the stage 2 was closed. Then, a new wafer was set on the stage 2, and the abovementioned each step was performed, to thereby form OF for another wafer. By repeating this process, the wafer group of this example was obtained from the same ingot. Further similarly, similar steps are performed on another ingot, to thereby manufacture, the wafer group from 41 ingots in total, in accordance with each ingot.

Then, the orientation accuracy (°) was obtained for each wafer of the obtained wafer group by X-ray diffraction measurement.

Figure 7:
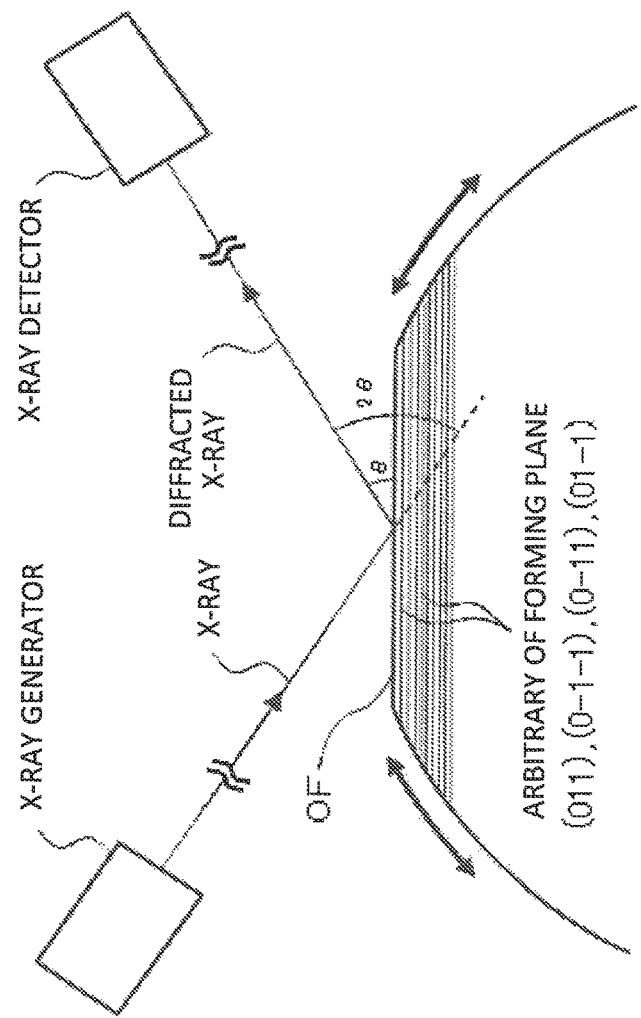
FIG. 7 is a schematic view showing a state of performing measurement of OF orientation accuracy according to an example.

Specifically, as shown in FIG. 7, the wafer was arbitrarily rotated in a direction shown by black arrow, with a physical plane of OF as a reference, while radiating X-ray onto OF cleavage plane. Then, by comparing a rotation angle at which Bragg diffraction occurs over a crystal plane of the planned OF cleavage plane, an amount of a deviation of the crystal plane from the physical plane was calculated, to thereby obtain OF orientation accuracy. For example, when the crystal plane of OF is (011) plane, θ=22.5° and 2θ=45° is established, and therefore the deviation amount from this angle is the OF orientation accuracy.

Comparative Example 1

The comparative example is the same as the example of the present invention, other than the points described below.

Si-doped GaAs ingots were prepared.

The number of wafers cut from one ingot was set to 73 to 167.

The cleavage of the wafer was done by an operator by hand. Specifically, both ends of the planned cleavage line were grasped with both hands, to thereby cleave the wafer by hand with scribe S put on the lower surface of the wafer as the start point.

Then, the orientation accuracy (°) was obtained for each wafer of the obtained wafer group by X-ray diffraction measurement.

Comparative Example 2

In this comparative example, after the wafers are cut from different ingots, the wafers on which relatively satisfactory OF was formed were selected and collected to form the wafer group. Other contents different from the first embodiment are as follows.

26 Si-doped GaAs ingots were prepared, the wafers were cut out from them, and 871 wafers in total on which relatively satisfactory OF was formed were selected.

The general stage 2 which was not freely double-openable was used.

During the cleavage step, the wafer was kept vacuum fixed to the stage 2.

The indenter 43 which was not freely swingable but fixedly disposed was used.

The indenter 43 was disposed horizontally without tilting.

When the abovementioned method was performed for a case of selecting 912 wafers in total, and for a case of selecting 815 wafers in total, separately.

Then, the orientation accuracy (°) was obtained for each wafer of the obtained wafer group by X-ray diffraction measurement.

<Result>

Table 1 below summarizes the above contents. For comparative example 2, the best results are listed in Table 1.

TABLE 1

| | | Range of number of sampled wafers [number] | OF Orientation accuracy | | | | | | | |
|---|---|---|---|---|---|---|---|---|---|---|
| | The number of ingots [number] | | Maximum Value [°] | Minimum Value [°] | Average value [°] | Maximum value of max-min in ingot [°] | Maximum value of max-ave in ingot [°] | Maximum value of ave-min in ingot [°] | Range of standard deviation value in ingot | Yield under condition of ± 0.010° |
| Example 1 | 41 | 76~170 | 0.004 | ~0.008 | ~0.002 | 0.010 | 0.006 | 0.006 | 0.0010~0.0015 | 100% |
| Comparative example 1 | 44 | 73~167 | 0.046 | ~0.016 | 0.005 | 0.047 | 0.041 | 0.002 | 0.0021~0.0058 | 89.9% |
| Comparative example 2 | — | 871 | 0.017 | ~0.014 | 0.000 | 0.031 | 0.017 | 0.014 | 0.0050 | 95.6% |

[Table 1]

With reference to table 1, it is found that example 1 satisfies a condition that OF orientation accuracy of each wafer is within ±0.010° which is a major premise, and also satisfies the above listed all conditions 1 to 4 regarding OF. Example 1 further shows that the wafer group is prepared from the same ingot, and yield is 100% under the condition of within ±0.010° OF orientation accuracy, and it is found that the continuity of the composition and the defect is sufficiently secured. In this case, three wafers were sampled and tested, and it was found that there were only three wafers in a state of missing teeth fragmentarily, and the continuity could be sufficiently secured. Therefore, example 1 also satisfies the above conditions α to γ.

On the contrary, in comparative example 1, all of the abovementioned conditions related to OF were not satisfied.

In comparative example 2, as a matter of course, the OF orientation accuracy is relatively better than that of the comparative example 1. Further, the yield under the condition of ±0.010° is 95.65%. Nevertheless, it is still impossible to achieve the orientation accuracy and the yield of example 1. Initially, the wafer group of comparative example 2 is constituted of wafers from different ingots. Therefore, the continuity of the composition and the defect is not secured at all, and of course, the abovementioned each condition is not satisfied. Accordingly, it is impossible to solve the problem of the present invention.

As a result thereof, according to the abovementioned example, it is clarified that there is provided a technique capable of providing the wafer group that facilitates securing the uniformity of products manufactured from the wafer group whose composition varies among wafers, capable of excluding uncertain factors in forming OF, and capable of forming OF with extremely high probability and extremely high accuracy.

DESCRIPTION OF SIGNS AND NUMERALS

1 Wafer manufacturing device
2 Stage
21 Protrusion
3 Scriber
31 Scribing pen
32 Support table
4 Pressing part
41 Pressing part body
411 Metal fitting
42 Swing part
421 Metal part
43 Indenter
44 Protruding part
5 Adjuster
W Wafer
W' Fragment
S Scribe
G Gap

The invention claimed is:

1. A wafer group constituted by a plurality of wafers obtained from the same ingot, with all wafers having an orientation flat (OF), wherein
the wafer group is constituted by 70 or more wafers, and in the OF orientation accuracy of the wafer group represented by an angle, the OF orientation accuracy in each wafer is within ±0.010°, and
for each wafer constituting the wafer group, a plot is formed in which the number of each wafer sequentially given from the side close to one end of the ingot is taken as X axis, and a concentration of a predetermined element in each wafer is taken as Y axis, and in this plot, the number of portions where continuity of the plot is lost, is a number equal to or less than 10% of a value obtained by adding the number of portions wherein continuity of the plot is lost to a total number of the wafers in the wafer group, and an increase/decrease value of the concentration of the predetermined element in a wafer of the next number is three times or less than the increase/decrease value assumed from the continuity of the plot, as compared with the wafer of an arbitrary number.

2. The wafer group according to claim 1, wherein at least one of the following conditions are satisfied:
(Condition 1) a value obtained by subtracting a minimum value from a maximum value of the OF orientation accuracy in each wafer, is 0.010° or less;
(Condition 2) a value obtained by subtracting an average value of the OF orientation accuracy of the wafer group from the maximum value of the OF orientation accuracy in each wafer, is 0.006° or less;
(Condition 3) a value obtained by subtracting the minimum value of the OF orientation accuracy in each wafer from the average value of the OF orientation accuracy of the wafer group, is 0.006° or less; and
(Condition 4) a standard deviation of the OF orientation accuracy of the wafer group, is 0.0015 or less.

3. The wafer group according to claim 1, wherein the wafer is a semiconductor wafer having a cleavage property.

4. The wafer group according to claim 1, wherein a plane constituting OF is any one of (011), (0-1-1), (0-11) and (01-1).

5. A wafer manufacturing device, with a wafer having two opposed lower and upper surfaces and an orientation flat (OF) formed by cleavage, comprising:
a stage which can be freely switched between fixing of the wafer and a release of a fixture from the lower surface, and which can be freely double-opened;
a scriber which puts scribe on the lower surface for cleaving the wafer, and which is disposed in a belt-like gap at a joint of the double-open stage, and movable along the gap;
a pressing part disposed above the stage and movable in a vertical direction; and
a door opening mechanism for double-opening the stage downward in conjunction with a downward movement of the pressing part,
wherein the pressing part includes an indenter which has a long portion for pressing the upper surface of the wafer, and which is disposed above the gap and along the gap of the stage so as to be is freely swingable along the gap in a pendulum manner.

6. The wafer manufacturing device according to claim 5, wherein the pressing part further comprises the door opening mechanism, and the door opening mechanism is a protruding part protruding downward of the indenter, and is a protruding part that pushes and double-opens the stage by moving the pressing part downward.

7. The wafer manufacturing device according to claim 6, further comprising an adjuster that adjusts a vertical relative position between the indenter and the protruding part in the pressing part.

8. The wafer manufacturing device according to claim 6, wherein the stage is freely double-opened and closed according to a movement amount of the protruding part.

9. The wafer manufacturing device according to claim 5, wherein the indenter is tilted so that one end of the long portion of the indenter is positioned lower than the end thereof in a stationary state.

10. A wafer manufacturing method, for a wafer having two opposed lower and upper surfaces and an orientation flat (OF) formed by cleavage, comprising the steps of:
putting a scribe on the lower surface for forming OF, at least as a part of a planned cleavage line, by a scriber disposed in a belt-like gap at a joint of the double-open stage which can be freely double-opened, with a lower surface side of the wafer fixed to the stage; and
double-opening the stage downward in conjunction with a downward movement of the pressing part by moving the pressing part including an indenter having a long portion, which is freely swingable along the gap in a pendulum manner, from an upper side to a lower side of the stage after release of a fixture of the wafer, and cleaving the wafer by pressing the planned cleavage line on the upper surface opposed to the scribe put on the lower surface, by the long portion of the indenter.

11. The wafer manufacturing method according to claim 10, wherein in the cleavage step, the stage is pushed and double-opened by a protruding part which is a part of the pressing part and protruding downward of the indenter, by moving the pressing part from an upper side to a lower side of the stage.

12. The wafer manufacturing method according to claim 11, wherein the cleavage step comprises the steps of:
bringing the long portion of the indenter into contact with the upper surface;

pressing the planned cleavage line on the upper surface by the long portion of the indenter; and pushing and double-opening the stage by the protruding part.

13. The wafer manufacturing method according to claim 11, comprising the steps of:

closing the double-opened stage by moving the protruding part upward after the cleavage step; and performing the scribing step and the cleavage step to another wafer after the closing step.

14. The wafer manufacturing method according claim 11, further comprising the step of:

adjusting a vertical relative position between the indenter and the protruding part in the pressing part according to a thickness of the wafer, before the cleavage step.

15. The wafer manufacturing method according to claim 10, wherein in the scribing step, a scribe is put on a periphery of the lower surface which is one end of the planned cleavage line, and the indenter is tilted so that one end of the long portion of the indenter is positioned lower than the other end thereof in a stationary state, and in the cleavage step, a portion of the planned cleavage line on the upper surface opposed to the other end where the scribe is not put on the planned cleavage line on the lower surface, are first brought into contact with the indenter.

16. A wafer group constituted by a plurality of wafers, with all of them having an orientation flat (OF), wherein the wafer group is constituted by 30 or more wafers, and for each wafer constituting the wafer group, a plot is formed in which the number of each wafer sequentially given from the side close to one end of an ingot is taken as X axis, and a concentration of a predetermined element in each wafer is taken as Y axis, and in this plot, the number of portions where continuity of the plot is lost, is a number equal to or less than 10% of a value obtained by adding the number of portions wherein continuity of the plot is lost to a total number of the wafers in the wafer group, and an increase/decrease value of the concentration of the predetermined element in a wafer of the next number is three times or less than the increase/decrease value assumed from the continuity of the plot, as compared with the wafer of an arbitrary number, and in an OF orientation accuracy of the wafer group represented by an angle, the OF orientation accuracy in each wafer is within ±0.010°.

* * * * *